United States Patent
Ch'ng et al.

(10) Patent No.: US 7,375,288 B1
(45) Date of Patent: May 20, 2008

(54) APPARATUSES AND METHODS FOR IMPROVING BALL-GRID-ARRAY SOLDER JOINT RELIABILITY

(75) Inventors: Sheng Cheang Ch'ng, Balik Pulau (MY); Azizi Abdul Rakman, Kulim (MY); Teik Sean Toh, Sungai Petani (MY)

(73) Assignee: Intel Corp., Santa Clara, CA (US)

( * ) Notice: Subject to any disclaimer, the term of this patent is extended or adjusted under 35 U.S.C. 154(b) by 474 days.

(21) Appl. No.: 10/903,694

(22) Filed: Jul. 30, 2004

(51) Int. Cl.
*H05K 1/16* (2006.01)
*H05K 3/30* (2006.01)

(52) U.S. Cl. .................. 174/260; 174/255; 174/261; 174/262; 174/266; 361/792; 361/793; 361/794; 361/795; 29/831; 29/846

(58) Field of Classification Search ............. 361/748, 361/760, 777, 802–810, 792–795, 749–751; 174/250, 255, 206, 261, 266, 260, 262, 254; 257/690, 697, 774, 778, 737, 738, 689; 29/417, 29/704, 830, 841, 831, 846; 324/755, 761
See application file for complete search history.

(56) References Cited

U.S. PATENT DOCUMENTS

| | | | | |
|---|---|---|---|---|
| 3,446,908 | A * | 5/1969 | Tally et al. ............. | 174/266 |
| 5,264,729 | A * | 11/1993 | Rostoker et al. ........ | 257/774 |
| 5,487,218 | A * | 1/1996 | Bhatt et al. .............. | 29/852 |
| 5,615,477 | A * | 4/1997 | Sweitzer ................. | 29/840 |
| 5,804,422 | A * | 9/1998 | Shimizu et al. .......... | 438/125 |
| 5,903,583 | A * | 5/1999 | Ullman et al. ............ | 372/35 |
| 5,928,005 | A * | 7/1999 | Li et al. .................... | 439/82 |
| 6,074,567 | A * | 6/2000 | Kuraishi et al. ......... | 216/18 |
| 6,246,015 | B1 * | 6/2001 | Kim ........................ | 174/261 |
| 6,308,446 | B1 * | 10/2001 | Healy ..................... | 40/600 |
| 6,375,064 | B1 * | 4/2002 | Edasawa et al. ........ | 228/254 |
| 6,758,263 | B2 * | 7/2004 | Krassowski et al. ..... | 165/185 |
| 6,784,374 | B2 * | 8/2004 | Ishida et al. ............. | 174/260 |
| 6,902,340 | B2 * | 6/2005 | Harris et al. ............ | 402/73 |
| 6,902,410 | B2 * | 6/2005 | Watanabe ............... | 439/66 |
| 2001/0036063 | A1 * | 11/2001 | Nagaya et al. .......... | 361/729 |
| 2003/0116312 | A1 * | 6/2003 | Krassowski et al. ..... | 165/185 |
| 2004/0111882 | A1 * | 6/2004 | Nakamura et al. ...... | 29/846 |
| 2004/0124517 | A1 * | 7/2004 | Hsieh et al. ............. | 257/686 |
| 2004/0180561 | A1 * | 9/2004 | Nguyen et al. .......... | 439/74 |

(Continued)

*Primary Examiner*—Jeremy C. Norris
*Assistant Examiner*—Xiaoliang Chen
(74) *Attorney, Agent, or Firm*—Troutman Sanders, LLP; James Hunt Yancey, Jr.

(57) ABSTRACT

In some embodiments, apparatuses and methods for improving ball-grid-array solder joint reliability in printed circuit boards. Such apparatuses may comprise, in an exemplary embodiment, a stiffened printed circuit board defining one or more cavities therein and including one or more stiffening members positioned, respectively, in the one or more cavities. The cavities and embedded stiffening members may be located proximate a ball-grid-array device footprint so as to resist deflection caused by the application of forces to the board by test probe pins during testing. Such methods may include, in an exemplary embodiment, creating one or more cavities in a middle sub-layer of a core layer of a stiffened printed circuit board and inserting one or more stiffening members, respectively, therein. Top and bottom sub-layers may then be secured to top and bottom surfaces of the middle sub-layer to complete the core layer. Other embodiments are also described and claimed.

28 Claims, 3 Drawing Sheets

U.S. PATENT DOCUMENTS

| | | |
|---|---|---|
| 2004/0197131 A1* | 10/2004 | Harris et al. .................. 402/73 |
| 2005/0121348 A1* | 6/2005 | Clare et al. ................. 206/440 |
| 2005/0258548 A1* | 11/2005 | Ogawa et al. .............. 257/778 |
| 2006/0063428 A1* | 3/2006 | Vasoya ....................... 439/595 |
| 2006/0121722 A1* | 6/2006 | Card et al. .................. 438/622 |

* cited by examiner

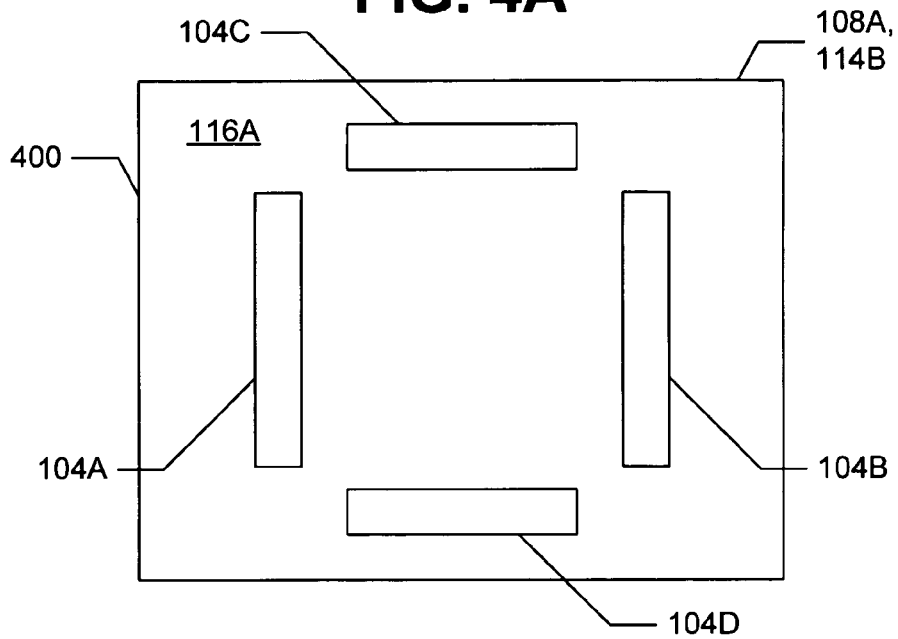
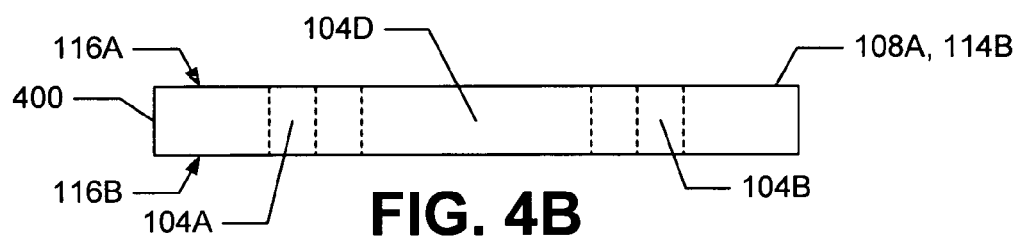
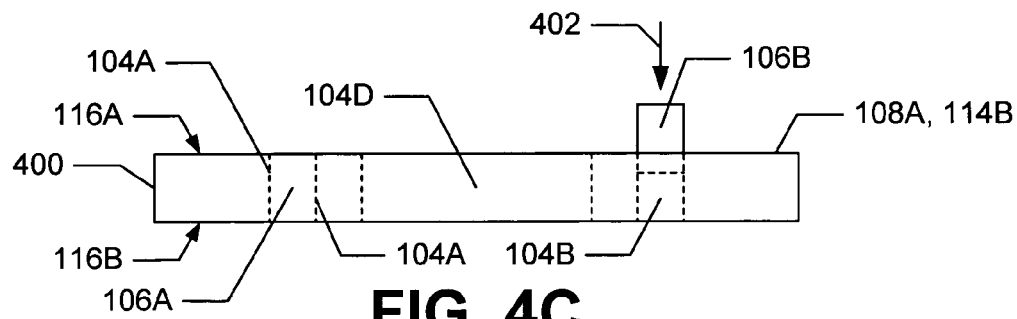
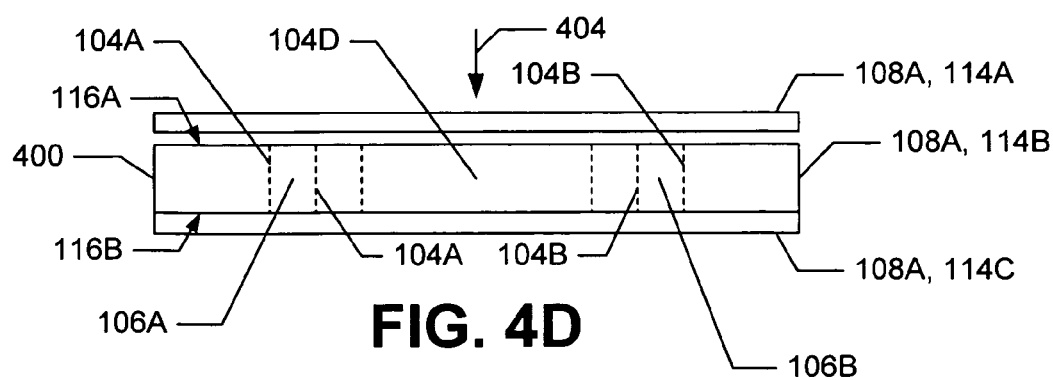

APPARATUSES AND METHODS FOR IMPROVING BALL-GRID-ARRAY SOLDER JOINT RELIABILITY

BACKGROUND

Many of today's printed circuit boards are tested during manufacture with automated test equipment having fixtures that hold the printed circuit boards in position while test probe pins are brought into contact with the boards at pre-determined test points. Upon contacting a board, the test probe pins each exert a force on the printed circuit board. For a board including a ball-grid-array device, numerous test probe pins must necessarily be employed to rapidly test the solder joints of the ball-grid-array device footprint. In order to resist the forces exerted by the test probe pins on one side of the board, a number of pushing rods are, typically, brought into contact with the other side of the board to apply counterbalance forces to the board.

Unfortunately, the ever-shrinking size and density of today's printed circuit boards and the inherent lack of unpopulated areas on such boards makes it increasingly difficult to apply counterbalance forces at appropriate locations necessary to offset the forces exerted on the printed circuit boards by the test probe pins. For those boards where it is not possible to apply counterbalance forces of sufficient magnitude at appropriate locations, imbalances in the forces applied to the boards by the test probe pins and pushing rods often cause solder joints in the area of a ball-grid-array device footprint to crack or open. To make matters worse, the layering of traces beneath a ball-grid-array device footprint in combination with the forces exerted by the test probe pins may enhance the possibility that board warpage may occur in and around the ball-grid-array device footprint. In turn, such board warpage may worsen the severity of any solder joint cracks caused by imbalance in the forces applied to such boards. What is needed, therefore, are methods and apparatuses for improving ball-grid-array solder joint reliability.

BRIEF DESCRIPTION OF THE DRAWINGS

FIG. 4A displays a partial, top plan view of the core layer of the stiffened printed circuit board of FIG. 1, in accordance with an exemplary embodiment of the present invention, after cavities have been created therein.

FIG. 4B displays a partial, side, elevational view of the core layer of the stiffened printed circuit board of FIG. 1, in accordance with an exemplary embodiment of the present invention, after cavities have been created therein.

FIG. 4C displays a partial, side, elevational view of the core layer of the stiffened printed circuit board of FIG. 1, in accordance with an exemplary embodiment of the present invention, during the insertion of stiffening members into the cavities thereof.

FIG. 4D displays a partial, side, elevational view of the core layer of the stiffened printed circuit board of FIG. 1, in accordance with an exemplary embodiment of the present invention, during the securing of top and bottom core sub-layers to a middle core sub-layer.

DETAILED DESCRIPTION

Figure 1:
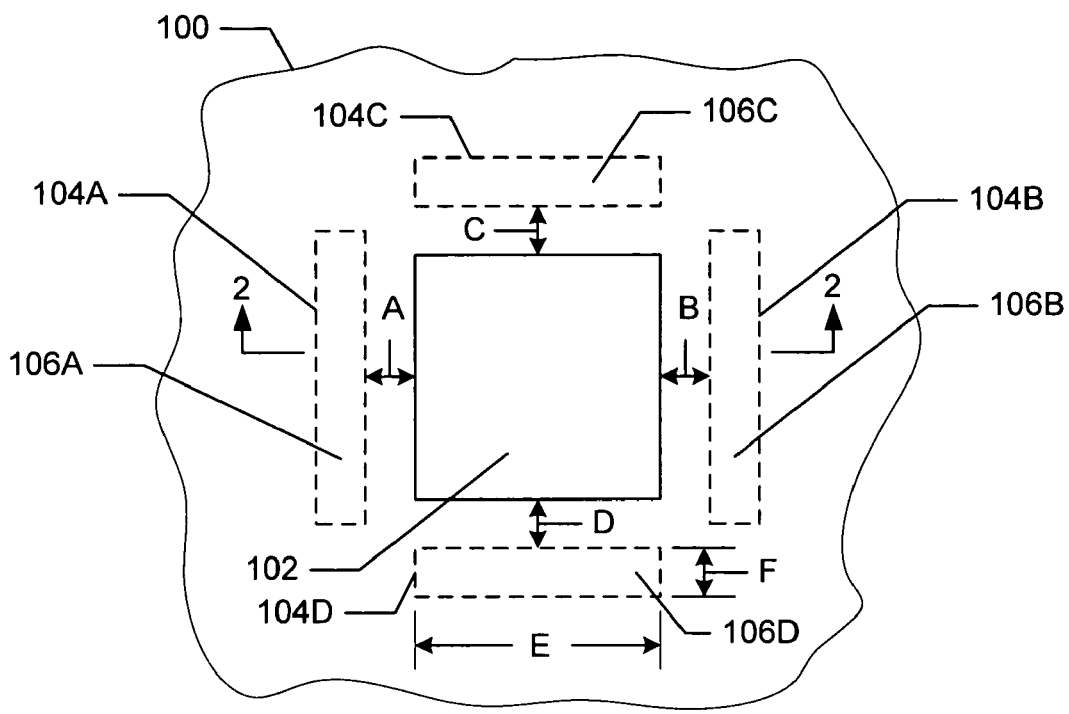
FIG. 1 displays a partial, top plan view of a stiffened printed circuit board in accordance with an exemplary embodiment of the present invention.

Referring now to the drawings in which like numerals represent like elements throughout the several views, FIG. 1 displays a partial, top plan view of a stiffened printed circuit board 100 showing a portion of the stiffened printed circuit board 100 in the vicinity of a ball-grid-array device footprint 102 in accordance with an exemplary embodiment of the present invention. The stiffened printed circuit board 100 may comprise one or more cavities 104 (shown by hidden lines in FIG. 1) formed therein at positions near and laterally displaced relative to the ball-grid-array device footprint 102 and one or more stiffening members 106 (shown by hidden lines in FIG. 1) which may reside, respectively, within the one or more cavities 104 and, hence, may be embedded in the stiffened printed circuit board 100. More particularly, the cavities 104 and stiffening members 106 may be laterally positioned about the periphery, or perimeter, of the ball-grid-array device footprint 102 with each cavity 104 and stiffening member 106 perhaps being, as illustrated in the exemplary embodiment of FIG. 1, laterally positioned relative to the ball-grid-array device footprint 102 at an offset distance "A", "B", "C", or "D" from a respective side of the footprint 102. In the exemplary embodiment of FIG. 1, each cavity 104 and stiffening member 106 is shown as being laterally parallel to a side of the ball-grid-array device footprint 102 with offset distances "A", "B", "C" and "D" being equal. Typically, when the cavities 104 and stiffening members 106 are arranged as illustrated in FIG. 1, offset distances "A", "B", "C" and "D" have equal measures that may be, for example only and not limitation, less than or equal to approximately five millimeters.

Generally, the precise number of cavities 104 and stiffening members 106 and the orientations and positions of the cavities 104 and stiffening members 106 relative to a ball-grid-array device footprint 102 in an exemplary embodiment may be selected based, at least in part, on knowledge of the locations at which forces may be exerted on the stiffened printed circuit board 100 by test probe pins during testing of the stiffened printed circuit board 100 and on the magnitude of the force that may be applied at each such location. Thus, in different exemplary embodiments, the number of corresponding pairs of cavities 104 and stiffening members 106 of a stiffened printed circuit board 100 may be the same or different with the cavities 104 and stiffening members 106 being: (a) laterally and individually oriented at the same or different positions relative to the same or different portions of a ball-grid-array device footprint 102; (b) oriented at the same or different angles relative to the ball-grid-array device footprint 102; and, (c) located at the same or different offset distances "A", "B", "C" or "D" relative to a ball-grid-array device footprint 102.

According to the exemplary embodiment of FIG. 1, each of the corresponding cavities 104 and stiffening members 106 may have an elongate shape and a substantially rectangular cross-section. The length, width, and height dimensions of a particular cavity 104 and its corresponding stiffening member 106 may be substantially the same, although the dimensions of the cavity 104 may, most likely, be slightly larger than similar dimensions of the corresponding stiffening member 106 present therein so as to enable insertion of the stiffening member 106 into the cavity 104 during manufacture as described in more detail below. When the cavities 104 and corresponding stiffening members 106 have an elongate shape and rectangular cross-section as illustrated in FIG. 1, the length dimension "E", width dimension "F", and height dimension "G" of a typical stiffening member 106 may have measures, for example only and not limitation, of approximately 50 millimeters, 1 millimeter, and 0.8 millimeters, respectively.

It should be noted that similar to the number, position and orientation of the cavities 104 and corresponding stiffening members 106, the size and shape of the cavities 104 and respective stiffening members 106 may also be selected based, at least in part, on knowledge of the magnitudes and locations of the forces that may be applied to the stiffened printed circuit board 100 during its testing. As a consequence and even though the stiffening members 106 of the exemplary embodiment illustrated in FIG. 1 may comprise elongated bars having a substantially rectangular cross-section with the respective cavities 104 having a similar shape, the stiffening members 106 and respective cavities 104 of different exemplary embodiments may comprise elongate or non-elongate stiffening members 106 and respective cavities 104 having the same or different cross-sections or having an L-shape, a Z-shape, a circular shape, an arcuate shape, or other shape when viewed in plan view. Further, it should be noted that although the stiffening members 106 and respective cavities 104 of the exemplary embodiment shown FIG. 1 all have, generally, similar shapes, a stiffened printed circuit board 100 of another exemplary embodiment may comprise one or more stiffening members 106 and respective cavities 104 having shapes which are the same as or different than one or more of the other stiffening members 106 and respective cavities 104 thereof.

Similarly, it should be noted that the material(s) of the respective stiffening members 106 may also be selected based, at least in part, on knowledge of the locations at which forces may be exerted on the stiffened printed circuit board 100 by test probe pins during testing of the stiffened printed circuit board 100 and on the magnitude of the force that may be applied at each such location. Thus, although the stiffening members 106 of the stiffened printed circuit board 100 of the exemplary embodiment illustrated in FIG. 1, may be manufactured, for example only and not limitation, from high-strength steel such as ASTM-A242 steel, the stiffening members 106 of stiffened printed circuit boards 100 of other exemplary embodiments may be manufactured from, for example only and not limitation, structural steel such as ASTM-A36, cold-rolled stainless (302) steel, aluminum alloys such as 2014-T6 or 6061-T6, and other materials having similar mechanical and/or structural properties. Additionally, in other exemplary embodiments, each stiffening member 106 of a stiffened printed circuit board 100 may be manufactured from the same or a different material than one or more of the other stiffening members 106 thereof.

Figure 2:
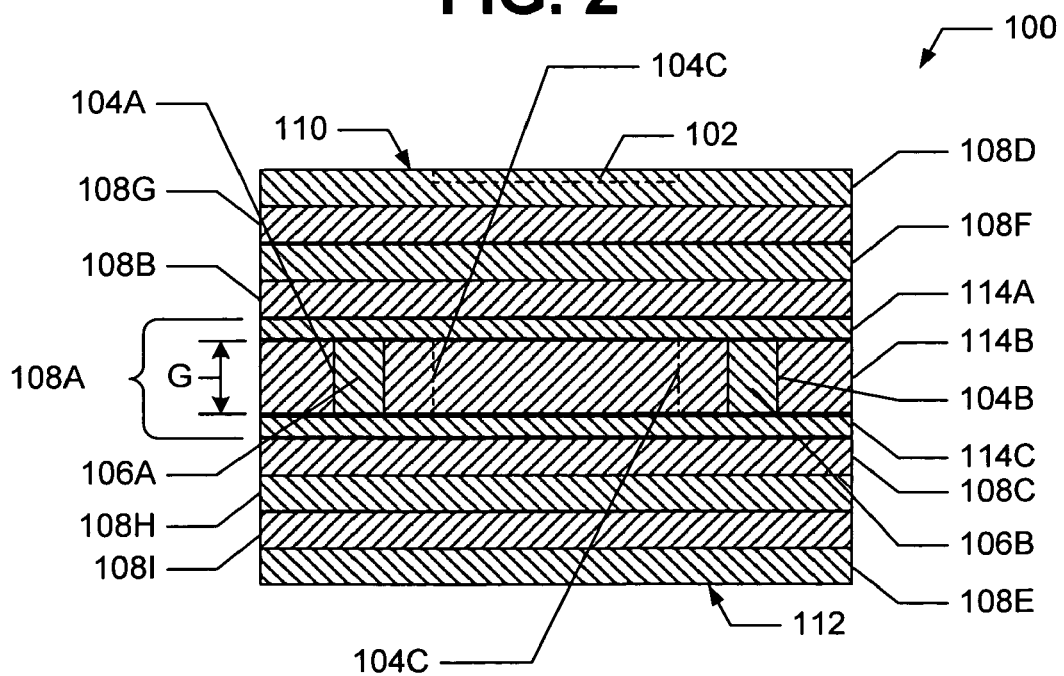
FIG. 2 displays a side, elevational, partial sectional view of the stiffened printed circuit board of FIG. 1 taken along lines 2-2 in accordance with an exemplary embodiment of the present invention.

FIG. 2 displays a side, elevational, partial sectional view of the stiffened printed circuit board of FIG. 1 taken along lines 2-2 in accordance with an exemplary embodiment of the present invention. As shown in FIG. 2, the stiffened printed circuit board 100 may comprise a sandwich-like structure including a plurality of layers 108 formed of different materials having the same or different thicknesses that reside between a top 110 and bottom 112 of the stiffened printed circuit board 100. More particularly, the stiffened printed circuit board 100 is shown in FIG. 2 as comprising nine layers 108, including: an electrically non-conductive core layer 108A; electrically conductive copper foil layers 108B, 108C respectively adjacent the core layer 108A; and, electrically conductive copper foil layers 108D, 108E separated from respective copper foil layers 108B, 108C by respective pairs of electrically non-conductive prepreg layers 108F, 108G and 108H, 108I. The ball-grid-array device footprint 102 may be etched within copper foil layer 108D near the top 110 of the stiffened printed circuit board 100.

Generally, as with conventional printed circuit board construction, the number of layers 108 of the stiffened printed circuit board 100 may depend, at least in part, on the number of layers of conductive paths, or traces, (and, hence, on the number of copper foil layers) that are required by a particular printed circuit board design. Therefore, although the stiffened printed circuit board 100 illustrated in FIG. 2 includes four layers of conductive paths, or traces, present in respective copper foil layers 108B, 108C, 108D, 108E and nine layers overall, a stiffened printed circuit board 100 of another exemplary embodiment may comprise any number of layers of conductive paths, or traces, (and, hence, any number of layers of copper foil) and any number of layers overall. For example and not limitation, in an exemplary embodiment in which a stiffened printed circuit board 100 comprises a motherboard of a computer system or other device having a microprocessor attached to the motherboard, the stiffened printed circuit board 100 may include four layers 108 and have an overall thickness, between its top 110 and bottom 112, of approximately sixty-two mils within a tolerance of plus eight and minus five mils.

The core layer 108A of the stiffened printed circuit board 100 may, as illustrated in FIG. 2, comprise a sandwich-like structure including three sub-layers 114A, 114B, 114C with sub-layer 114A forming a top sub-layer, sub-layer 114C forming a bottom sub-layer, and sub-layer 114B forming a middle layer disposed between sub-layers 114A, 114C. Sub-layer 114B may, in the exemplary embodiment, have top and bottom surfaces 116A, 116B and define cavities 104A, 104B therein extending between the top and bottom surfaces 116A, 116B. Stiffening members 106A, 106B may reside, respectively, within cavities 104A, 104B such that they are embedded within the core layer 108A and are bounded at their sides by material of sub-layer 114B and at their tops and bottoms by material of sub-layers 114A, 114C, respectively. Sub-layers 114A, 114C may be secured to sub-layer 114C by an adhesive substance or, in another exemplary embodiment, by another substance or method of attachment that is adapted to secure them to sub-layer 114C. The core layer 108A of a stiffened printed circuit board 100 employed, in an exemplary embodiment as a motherboard for a computer system, may be manufactured from a non-conductive material such as glass fiber and epoxy resin and may have an overall thickness of approximately nineteen mils.

Figure 3:
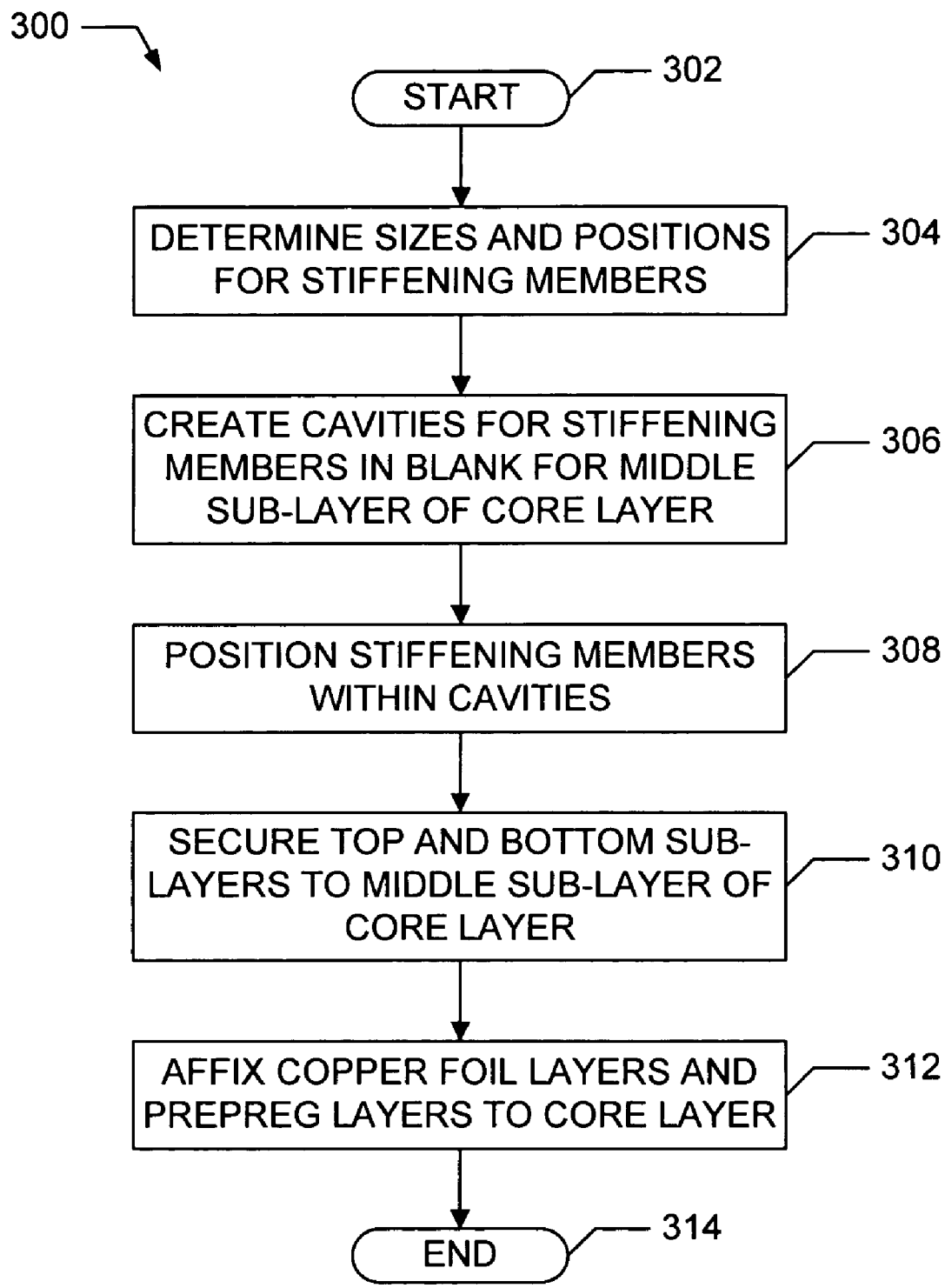
FIG. 3 displays a flowchart representation of a method of manufacturing the stiffened printed circuit board of FIG. 1 in accordance with an exemplary embodiment of the present invention.

FIG. 3 displays a flowchart representation of a method 300 of manufacturing the stiffened printed circuit board 100 of FIG. 1 in accordance with an exemplary embodiment of the present invention. After starting at 302, the size(s), shape(s), position(s), and orientation(s) for one or more stiffening members 106 (and, for one or more cavities 104 therefor) laterally offset relative to the sides of a ball-grid-array device footprint 102 may be determined at 304 based, at least in part, on knowledge of the mechanical properties of the material(s) of the stiffening members 106 and of the magnitudes and locations of the forces that may be exerted on the stiffened printed circuit board 100 by test probe pins during board testing. Then, at 306, one or more cavities 104 having the determined size(s) and position(s) may be created in a blank 400 for core sub-layer 114B of the stiffened printed circuit board 100 having an appropriate size and thickness. The one or more cavities 104 may extend between top and bottom surfaces 116A, 116B of core sub-layer 114B as illustrated by FIGS. 4A and 4B. A milling machine may, for example only and not limitation, be used to create the one or more cavities 104.

Continuing at 308, one or more stiffening members 106 having appropriate size(s), shape(s), and material(s) may be positioned within the respective and corresponding one or more cavities 104 of the blank 400 (as illustrated by downward arrow 402 in FIG. 4C indicating insertion of stiffening member 106B into cavity 104B) during manufacture of sub-layer 114B of core layer 108A of the stiffened printed circuit board 100. Next, at 310, core sub-layers 114A, 114C may be secured, respectively, to top and bottom surfaces 116A, 116B of core sub-layer 114B with, for example and not limitation, an adhesive substance, to complete manufacture of core layer 108A. In this regard, downward-extending arrow 404 in FIG. 4D illustrates core sub-layer 114A being directed into position adjacent and secured to the top surface 116A of core sub-layer 114B (core sub-layer 114C, as seen in FIG. 4D, having already been secured to the bottom surface 116B of core sub-layer 114B). Subsequently, at 312, copper foil layers 108B, 108C, 108D, 108E and prepreg layers 108F, 108G, 108H, 108I may be affixed to core layer 108A to produce a completed stiffened printed circuit board 100. Method 300 then ends at 314.

The various embodiments of the present invention provide apparatuses and methods for improving ball-grid-array solder joint reliability. Some embodiments of the invention provide strengthened printed circuit boards capable of withstanding external test forces so that the printed circuit boards do not warp as a result of external test forces. Some embodiments also provide strengthened circuit boards capable of not warping during solder reflow processes. The printed circuit boars may be strengthened with stiffner bars or other materials capable of being placed within a printed circuit board core layer and strengthening a printed circuit board. Other embodiments of the present invention include methods used to manufacture strengthened printed circuit boards capable of embedding strengthening materials into a printed circuit board without disturbing current circuit board manufacturing processes.

The various embodiments of the present invention have been described with reference to the above discussed embodiments, but the present invention should not be construed to cover only these embodiments. Rather, these embodiments are only exemplary embodiments. Variations of the above exemplary embodiments may suggest themselves to those skilled in the art or others without departing from the spirit and scope of the present invention. The appended claims and their full range of equivalents should, therefore, only define the full scope of the present invention.

We claim:

1. An apparatus, comprising:
   a first layer of material having a first surface and a second surface, said first surface having a footprint of a ball-grid-array device thereon adapted to receive the ball-grid-array device;
   a second layer of material overlying said second surface of said first layer; and,
   a plurality of stiffening members positioned within said second layer at a position laterally proximate said footprint of said ball-grid-array device; and wherein the plurality of stiffening members are spaced apart from edges of footprint such that the stiffening members substantially surround edges of the footprint, wherein the stiffening members are spaced apart from each other such that gaps are defined between ends of the stiffening members, and the stiffening members each comprise a front facing surface such that the front facing surfaces of the stiffening members are disposed proximate to face edges of the footprint.

2. The apparatus of claim 1, wherein the first layer of material directly contacts the second layer of material.

3. The apparatus of claim 2, wherein a third layer of material is disposed between the first layer of material and the second layer of material.

4. The apparatus of claim 3, wherein said second layer has a first surface and a second surface opposed thereto, and wherein said stiffening members extend between said first surface and said second surface.

5. The apparatus of claim 4, wherein said second layer includes a first sub-layer and a second sub-layer extending adjacent to said first sub-layer, and wherein said stiffening members are positioned within said first sub-layer.

6. The apparatus of claim 5, wherein said second layer further includes a third sub-layer extending adjacent to said first sub-layer, and wherein said first sub-layer is interposed between said second sub-layer and said third sub-layer.

7. The apparatus of claim 6, wherein said second sub-layer and said third sub-layer are in contact with and secured to said first sub-layer.

8. The apparatus of claim 1, wherein said second layer defines a cavity therein at said position laterally proximate said footprint of said ball-grid-array device, and wherein said stiffening member resides within said cavity.

9. The apparatus of claim 1, wherein said stiffening members comprise a first stiffening member and a second stiffening member positioned within said second layer at a position laterally proximate said footprint of said ball-grid-array device.

10. The apparatus of claim 9, wherein said position comprises a first position and said second layer defines a first cavity therein at said first position laterally proximate said footprint of said ball-grid-array device, wherein said second layer further defines a second cavity therein at a second position laterally proximate said footprint of said ball-grid-array device, and wherein the first stiffening member resides within said first cavity and said second stiffening member resides within said second cavity.

11. The apparatus of claim 1, wherein said footprint of said ball-grid-array device has a side, and wherein said stiffening members are positioned laterally offset relative to said side.

12. The apparatus of claim 11, wherein said side comprises a first side and said footprint of said ball-grid-array device has a second side, and wherein said stiffening members comprise a first stiffening member and a second stiffening member positioned within said second layer at a position laterally offset relative to said second side.

13. A method, comprising:
   determining a position for a plurality of stiffening members relative to a footprint of a ball-grid-array device on a first layer of a printed circuit board;
   positioning the stiffening members within one or more cavities of a second layer of the printed circuit board at the determined positions;
   configuring the cavity to comprise a portion having a generally rectangular cross sectional shape and the stiffening member to comprise a portion generally corresponding to the generally rectangular cross sectional shapes portion of the cavity disposing the stiffening members around edges of the footprint at substantially the same offset position such that the stiffening members are disposed about the edges of the footprint and such that gaps are defined between ends of the stiffening members and between the footprint and the stiffening members;

disposing the stiffening members in opposing positions within the second layer and configuring the stiffening members such that directly opposing stiffening members are approximately the same size; and, overlaying the first layer of the printed circuit board over the second layer of the printed circuit board.

14. The method of claim 13 further comprising securing the first layer of the printed circuit board to the second layer of printed circuit board.

15. The method of claim 14 further comprising disposing a third layer of printed circuit board between the first and second layer of printed circuit board.

16. The method of claim 15, wherein the method further comprises creating a cavity in the second layer of the printed circuit board at the determined position and inserting the stiffening members within the cavity.

17. The method of claim 16 wherein the second layer of the printed circuit board comprises a sub-layer having a first surface and a second surface opposed to the first surface, and wherein positioning the stiffening members comprises creating a cavity within the sub-layer at the determined position and extending between the first surface and the second surface.

18. The method of claim 17, wherein the sub-layer comprises a first sub-layer and the method further comprises securing a second sub-layer to the first surface of the first sub-layer.

19. The method of claim 18, wherein the method further comprises securing a third sub-layer to the second surface of the first sub-layer.

20. The method of claim 19, wherein positioning the stiffening members further comprises inserting the stiffening members within the cavity.

21. The method of claim 20, wherein the determined position is laterally offset relative to the footprint of the ball-grid-array device on the first layer of a printed circuit board.

22. The method of claim 21, wherein the stiffening members comprise a first stiffening member and the position comprises a first position, and wherein the method further comprises positioning a second stiffening member within the second layer of the printed circuit board at a second position laterally offset relative to the footprint of the ball-grid-array device on the first layer of the printed circuit board.

23. The method of claim 22, wherein determining the position for the stiffening members includes determining a location at which the stiffening member lessens deflection of the printed circuit board when a force is exerted thereon by a test probe pin.

24. A system, comprising:

a printed circuit board having a footprint thereon adapted to receive a ball-grid-array device, said printed circuit board including a plurality of stiffening members positioned therein at a position laterally proximate said footprint;

wherein each of the stiffening members comprising a substantially rectangular shaped section and being spaced apart from the footprint at substantially the same offset distance, each of the stiffening members having a length substantially equivalent to the width of the footprint such that the stiffening members substantially encircle edges of the footprint; and, a microprocessor attached to said printed circuit board.

25. The system of claim 24, wherein said printed circuit board further comprises a core layer and a copper foil layer, and wherein said stiffening members are present within said core layer.

26. The system of claim 25, wherein said core layer comprises a first sub-layer defining a cavity therein for receipt of said stiffening member, and wherein said core layer further comprises a second sub-layer secured to said first sub-layer.

27. The system of claim 26, wherein said core layer has a first surface and a second surface opposed to said first surface, and wherein said core layer defines a cavity therein extending between said first surface and said second surface.

28. The system of claim 27, wherein said stiffening members reside within said cavity.

* * * * *